(12) United States Patent
Matsuyama et al.

(10) Patent No.: US 11,915,959 B2
(45) Date of Patent: Feb. 27, 2024

(54) SUBSTRATE TREATMENT APPARATUS AND TRANSFER SCHEDULE CREATION METHOD

(71) Applicant: Tokyo Electron Limited, Tokyo (JP)

(72) Inventors: Kenichirou Matsuyama, Koshi (JP); Yuichiro Kawasaki, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 391 days.

(21) Appl. No.: 17/388,195

(22) Filed: Jul. 29, 2021

(65) Prior Publication Data
US 2022/0044953 A1    Feb. 10, 2022

(30) Foreign Application Priority Data

Aug. 5, 2020   (JP) ................. 2020-133022

(51) Int. Cl.
*H01L 21/677*     (2006.01)
*H01L 21/67*     (2006.01)

(52) U.S. Cl.
CPC .... *H01L 21/67745* (2013.01); *H01L 21/6773* (2013.01); *H01L 21/67276* (2013.01)

(58) Field of Classification Search
None
See application file for complete search history.

(56) References Cited

U.S. PATENT DOCUMENTS

2019/0237350 A1*   8/2019   Mitsuya ............ H01L 21/67745

FOREIGN PATENT DOCUMENTS

JP     H08-153765 A     6/1996

* cited by examiner

*Primary Examiner* — Ryan A Jarrett
(74) *Attorney, Agent, or Firm* — POSZ LAW GROUP, PLC

(57) ABSTRACT

A substrate treatment apparatus includes: treatment parts each of which performs a predetermined treatment; and a transfer mechanism which transfers a transfer object. Transfer objects are transferred in a predetermined transfer-in order into the substrate treatment apparatus. The substrate treatment apparatus includes a controller which acquires a process job. The controller determines before starting transfer of one transfer object to the treatment part, when the process job is different between the one transfer object and a preceding transfer object transferred into the substrate treatment apparatus prior to the one transfer object and a same kind of treatment is included in the respective process jobs thereof, a possibility of performing preceding execution of executing the same kind of treatment on the one transfer object previous to completion of the same kind of treatment on the preceding transfer object.

8 Claims, 9 Drawing Sheets

FIG.5

| PJ1 | C | SBU | TRS | RINSE: UNIT 31 | THERMAL: UNIT 40 | DEVELOPMENT: UNIT 30 | TRS | SBU | C | | |
| PJ2 | C | | | | SBU | | | | | TRS | DEVELOPMENT: UNIT 30 | TRS | SBU | C |
| PJ3 | | | C | SBU | TRS | THERMAL: UNIT 41 | TRS | SBU | C | | |

FIG.7

PJ1 | C | SBU | TRS | RINSE UNIT 31 | SBU | TRS | DEVELOPMENT UNIT 30 | TRS | SBU | C

PJ2 | C | SBU | TRS | DEVELOPMENT UNIT 30 | TRS | SBU | C | THERMAL UNIT 40 | DEVELOPMENT UNIT 30 | TRS | SBU | C

FIG.9

| | | | | | | | |
|---|---|---|---|---|---|---|---|
| PJ1 | C | SBU | TRS | RINSE: UNIT 31 | THERMAL: UNIT 40 | DEVELOPMENT: UNIT 30 | TRS | SBU | C |
| PJ4 | | | C | SBU | TRS | THERMAL: UNIT 40 | DEVELOPMENT: UNIT 30 | TRS | SBU | C |

SUBSTRATE TREATMENT APPARATUS AND TRANSFER SCHEDULE CREATION METHOD

CROSS REFERENCE TO RELATED APPLICATIONS

This application is based upon and claims the benefit of priority of the prior Japanese Patent Application No. 2020-133022, filed in Japan on Aug. 5, 2020, the entire contents of which are incorporated herein by reference.

TECHNICAL FIELD

This disclosure relates to a substrate treatment apparatus and a transfer schedule creation method.

BACKGROUND

Japanese Laid-open Patent Publication No. H8-153765 discloses that when the calculated minimum standby cycle is less than the standard standby cycle corresponding to the number of times of circulation transfer required for execution of a predetermined treatment procedure of a preceding substrate, the first circulation transfer of a following substrate by a transfer robot is delayed in a range of the minimum standby cycle or more and less than the standard standby cycle after the circulation transfer of the preceding substrate.

SUMMARY

One embodiment of this disclosure is a substrate treatment apparatus for treating a substrate, including: a plurality of treatment parts each configured to perform a predetermined treatment; a transfer mechanism configured to transfer a transfer object, a plurality of transfer objects being transferred in a predetermined transfer-in order into the substrate treatment apparatus; and a controller configured to acquire a process job for transferring the transfer object by the transfer mechanism to at least one of the treatment parts and performing the treatment on the transfer object, wherein the controller is configured to determine before starting transfer of one transfer object to the treatment part, when the process job is different between the one transfer object and a preceding transfer object transferred into the substrate treatment apparatus prior to the one transfer object and a same kind of treatment is included in the respective process jobs thereof, a possibility of performing preceding execution of executing the same kind of treatment on the one transfer object previous to completion of the same kind of treatment on the preceding transfer object.

BRIEF DESCRIPTION OF THE DRAWINGS

FIG. 5 is a diagram illustrating an example of the transfer schedule.

FIG. 7 is a diagram illustrating another example of the transfer schedule.

FIG. 9 is a diagram illustrating another example of the transfer schedule.

DETAILED DESCRIPTION

Figure 1:
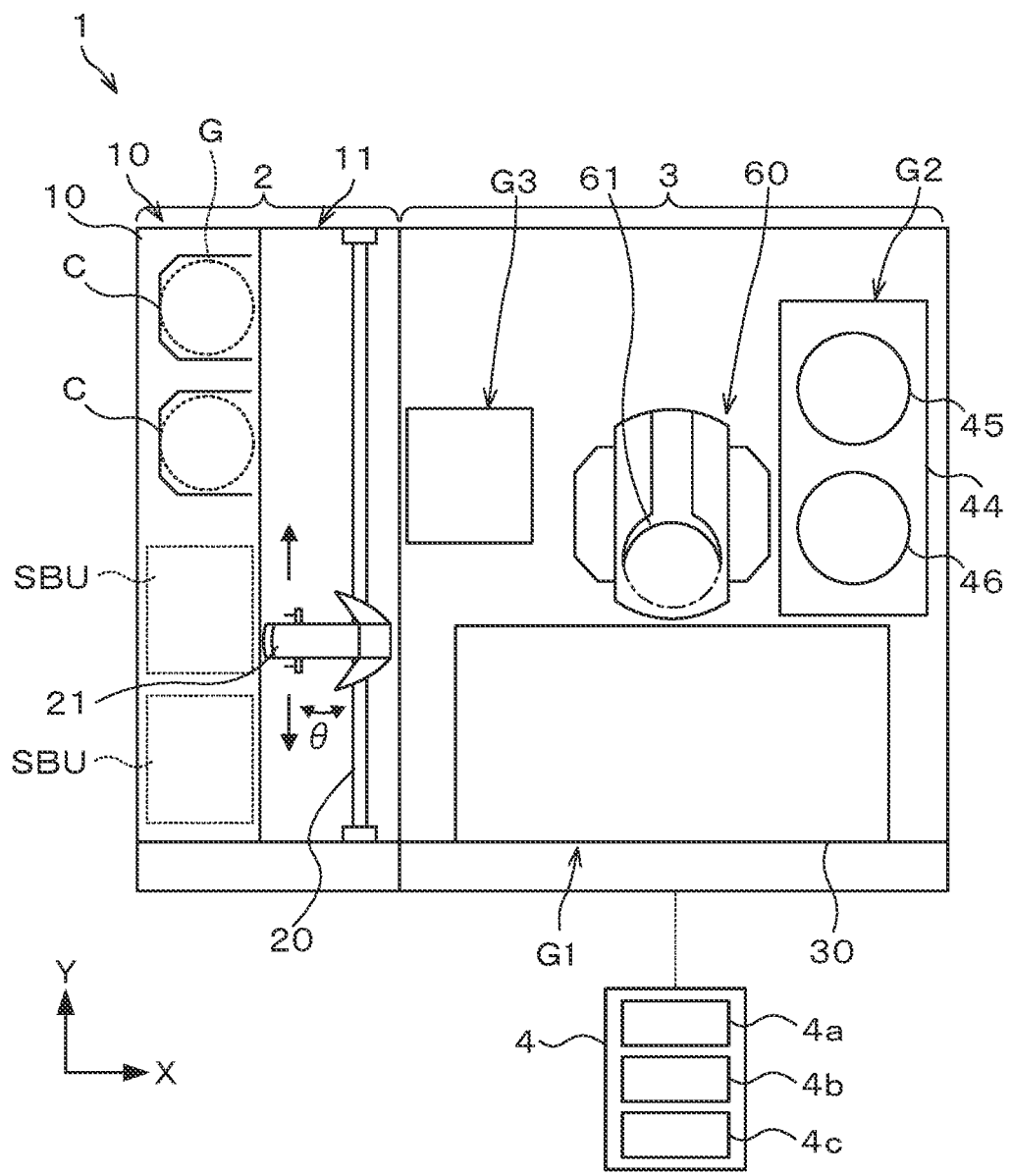
FIG. 1 is an explanatory view illustrating the outline of an internal configuration of a substrate treatment apparatus according to an embodiment.

In a manufacturing process of, for example, a semiconductor device, photolithography processing is performed on, for example, a semiconductor wafer (hereinafter, referred to as a "wafer") to than a predetermined resist pattern on the wafer. In the photolithography processing, exposure processing of the wafer is performed using a mask having a predetermined pattern formed thereon.

Also in forming the predetermined pattern on a substrate for mask, the photolithography processing is performed. More specifically, first, a resist coating treatment of applying a resist solution onto the substrate to than a coating film, exposure processing of exposing the resist film into a predetermined pattern, a heat treatment of heating the exposed resist film, a developing treatment of developing the exposed and heated resist film, and so on are sequentially performed to form a predetermined resist pattern on a substrate. Thereafter, an etching treatment is performed on the substrate using the resist pattern as a mask, and a removal treatment of the resist film is performed to form a predetermined pattern on the substrate.

The treatments included in the above photolithography processing are performed in separate treatment units and, for example, a plurality of treatment units of them are installed in one substrate treatment apparatus. The transfer schedule of the substrate in the substrate treatment apparatus is decided for each substrate, for example, in the order of the transfer into the substrate treatment apparatus.

Incidentally, the period when the treatment unit is not in use is long depending on the decision method of the transfer schedule, thus failing to obtain high throughput in some cases. For example, in the case where the treatment which should be performed on the substrate in the substrate treatment apparatus defers among substrates which are successively transferred thereinto, the period when the treatment unit is not in use is long depending on the decision method of the transfer schedule, thus failing to obtain high throughput in some cases. Therefore, various decision methods of the transfer schedule have been conventionally proposed.

The technique according to this disclosure further improves the throughput in the substrate treatment apparatus for treating the substrate.

Hereinafter, a substrate treatment apparatus and a transfer schedule creation method according to an embodiment will be explained referring to the drawings. Note that the same codes are given to components having substantially the same functional configurations in the description to omit duplicated explanation.

<Substrate Treatment Apparatus>

Figure 2:
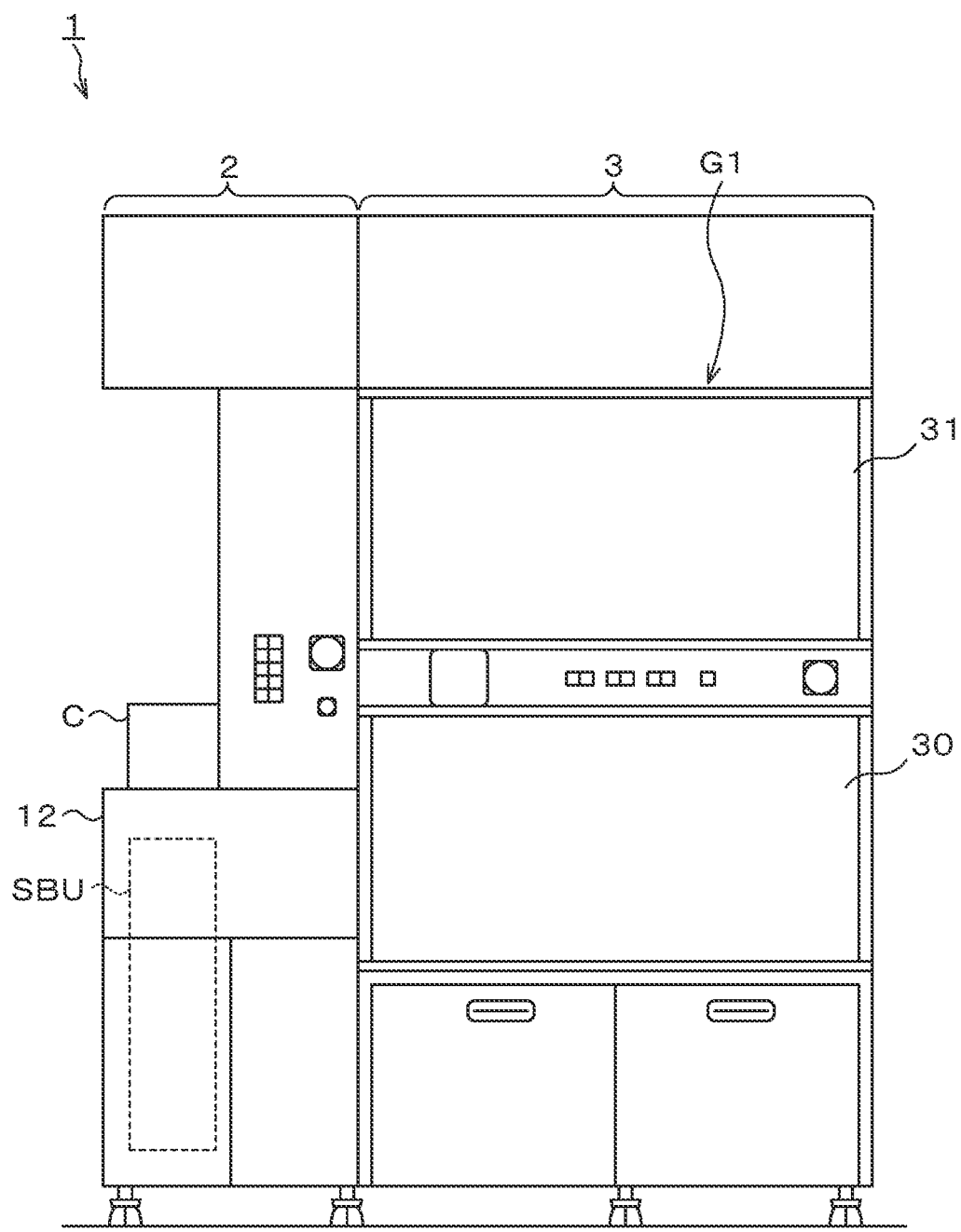
FIG. 2 is a front view illustrating the outline of the internal configuration of the substrate treatment apparatus according to the embodiment.
Figure 3:
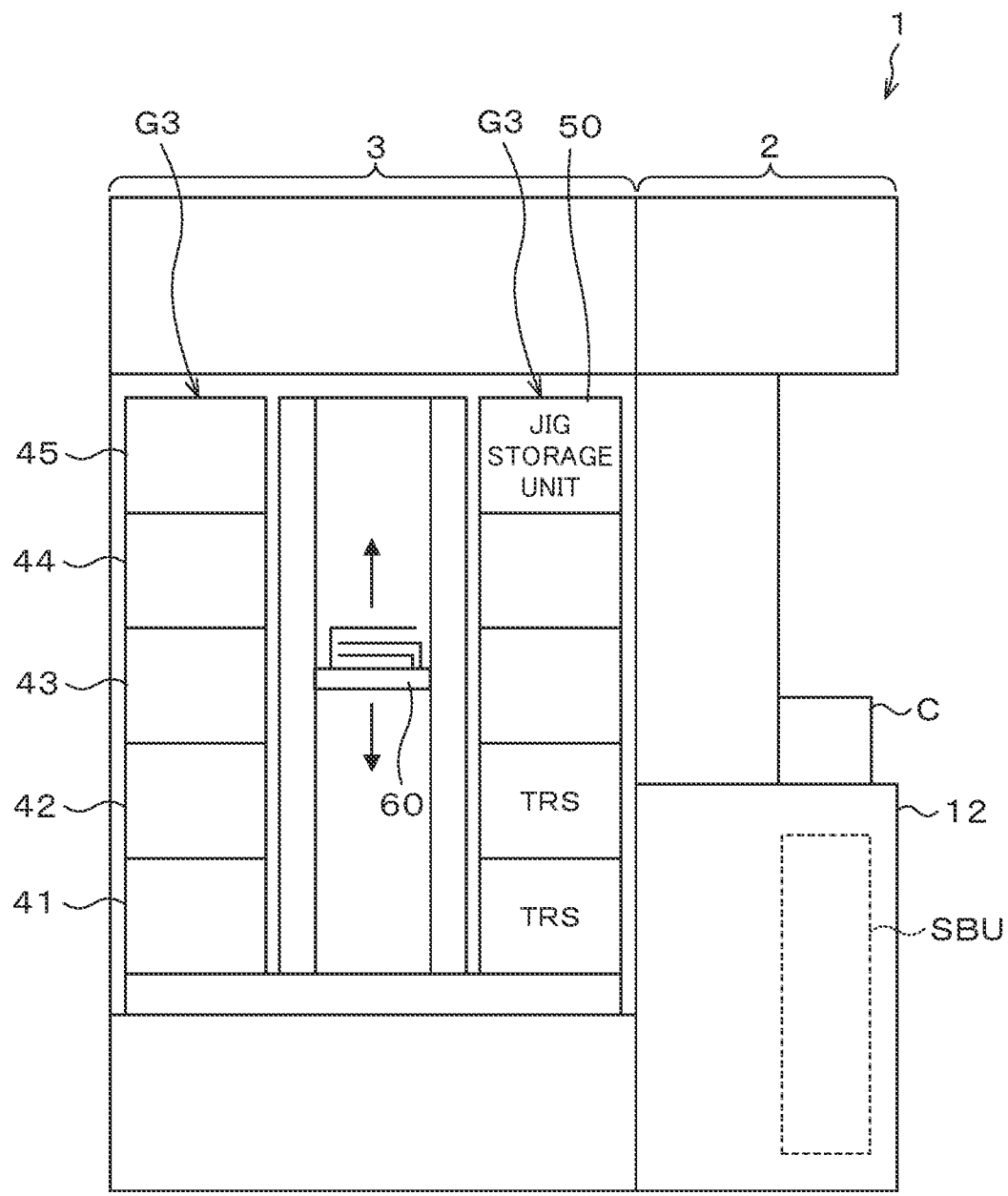
FIG. 3 is a rear view illustrating the outline of the internal configuration of the substrate treatment apparatus according to the embodiment.

FIG. 1 is an explanatory view illustrating the outline of an internal configuration of a substrate treatment apparatus 1 according to an embodiment, FIG. 2 an FIG. 3 are a front view and a rear view illustrating the outline of the internal configuration of the substrate treatment apparatus 1, respectively. Hereinafter, the case of treating a substrate G for mask as the substrate will be explained. The substrate G is made of, for example, glass.

The substrate treatment apparatus 1 has, for example, a cassette station 2 into/out of which a cassette C is transferred from/to the outside, and a treatment station 3 including a plurality of various treatment units which perform predetermined treatments such as the developing treatment and PEB (Post-Exposure Bake) treatment and so on as illustrated in FIG. 1. The substrate treatment apparatus 1 has a configuration in which the cassette station 2 and the treatment station 3 are integrally connected. The substrate treatment apparatus 1 further has a controller 4 which controls the substrate treatment apparatus 1.

The cassette station 2 is divided, for example, into a cassette transfer-in/out section 10 and a substrate transfer section 11. The cassette transfer-in/out section 10 is provided, for example, at an end on an X-direction negative direction (left direction in FIG. 1) side in the substrate treatment apparatus 1.

In the cassette transfer-in/out section 10, a cassette stage 12 is provided. A part on a Y-direction positive direction (upper direction in FIG. 1) side on the cassette stage 12 is configured such that a plurality of, for example, two cassettes C can be mounted. The cassettes C can be mounted side by side in a line in a Y-direction (up-down direction in FIG. 1) being the horizontal direction. The cassette C is a transportable container configured to be capable of housing the substrate G and transferable by a cassette transfer apparatus (not illustrated) such as an OHT (Overhead Hoist Transfer) provided outside the substrate treatment apparatus 1. In this embodiment, only one substrate G is housed in each cassette C. Further, in this embodiment, the cassette C which is emptied out because the substrate G is taken out by a later-explained substrate transfer unit 21 is removed from the top of the cassette stage 12 by the above cassette transfer apparatus, and another cassette C housing a substrate U is mounted on the cassette stage 12 by the above cassette transfer apparatus. The emptied cassette C is returned by the above cassette transfer apparatus to the cassette stage 12 at predetermined timing, and the substrate G which has been transferred out of this cassette C and treated by the substrate treatment apparatus 1 is housed therein by the substrate transfer unit 21. Note that, hereinafter, a cassette C housing a substrate G before the treatment by the substrate treatment apparatus 1 is called a cassette C-IN, and a cassette C housing a substrate G after the treatment by the substrate treatment apparatus is called a cassette C-OUT in some cases.

Further, inside on a Y-direction negative direction (lower direction in FIG. 1) side of the cassette stage 12, a buffer unit SBU as a standby part is provided. The buffer unit SBU is for temporarily housing the substrate G. The buffer unit SBU is a part where the substrate G stands by at any timing between the start of transfer and the end of transfer. Specifically, the buffer unit SBU is a part where the substrate G stands by at any timing between the transfer in from the cassette C-IN and the transfer out to the cassette C-OUT. Note that, hereinafter, a buffer unit SBU as a transfer-in side standby part where a substrate G before the treatment by the substrate treatment apparatus 1 is called a buffer unit SBU-IN, and a buffer unit SBU as a transfer-out side standby part where a substrate G after the treatment by the substrate treatment apparatus 1 is called a buffer unit SBU-OUT in some cases.

In the substrate transfer section 11 the substrate transfer unit 21 is provided as a transfer mechanism movable on a transfer path 20 extending in the Y-direction as illustrated in FIG. 1. The substrate transfer unit 21 is movable also in a vertical direction and around a vertical axis (in a θ-direction). The substrate transfer unit 21 can transfer the substrate G between the cassette C on the cassette stage 12 and a later-explained delivery unit TRS in a third block G3 in the treatment station 3, between the cassette C on the cassette stage 12 and the buffer unit SBU on the cassette stage 12, and between the buffer unit SBU on the cassette stage 12 and the delivery unit TRS in the third block G3.

In the treatment station 3, a plurality of, for example, three blocks such as first to third blocks G1, G2, G3 each including various units are provided. For example, the first block G1 is provided on the front side (Y-direction negative direction side in FIG. 1) in the treatment station 3. Further, the second block G2 is provided on the side (X-direction positive direction side in FIG. 1) opposite to the cassette station 2 side in the treatment station 3, and the third block G3 is provided on the cassette station 2 side X direction negative direction side in FIG. 1) in the treatment station 3.

In the first block G1 for example, as illustrated in FIG. 2, two solution treatment units 30, 31 each configured to be able to perform a spin coating treatment on the substrate G are arranged to be stacked one on the other. The solution treatment unit 30 is for a developing treatment, and the solution treatment unit 31 is for a rinse treatment. The rinse treatment is a treatment of cleaning the surface of the substrate G using a treatment solution to be used in the developing treatment. Note that both of the solution treatment units 30, 31 may be used for the developing treatment and the rinse treatment. Two solution treatment units 30 are arranged side by side, for example, in the vertical direction. Further, the numbers and the arrangement of the solution treatment units can be arbitrarily selected.

In the solution treatment unit 30, for example, the spin coating treatment using a predetermined treatment solution is performed on the substrate G. In the spin coating treatment, for example, the treatment solution is discharged from a discharge nozzle (not illustrated) onto the substrate G and the substrate G is rotated to diffuse the treatment solution on the surface of the substrate G.

In the second block G2, for example, as illustrated in FIG. 3, five thermal treatment units 40 to 44 are provided each of which performs a thermal treatment such as heating and cooling of the substrate G. The numbers and the arrangement of the thermal treatment units can also be arbitrarily selected.

The thermal treatment unit 40 to 44 has a cooling plate 45 and a hot plate 46. In the thermal treatment on the substrate G by the thermal treatment unit 40 to 44, for example, the substrate G is first mounted on the cooling plate 45 and then mounted on the hot plate 46. The delivery of the substrate G between the cooling plate 45 and the hot plate 46 may be performed by a transfer mechanism (not illustrated) incorporated in the thermal treatment unit 40 to 44 or may be performed by a later-explained substrate transfer unit 60. Note that, hereinafter, it is assumed that the delivery of the substrate G between the cooling plate 45 and the hot plate 46 is performed by the transfer mechanism (not illustrated) in the thermal treatment unit 40 to 44 and the time required for the transfer by the transfer mechanism is included in the thermal treatment time in the thermal treatment unit 40.

In the third block G3, a plurality of, for example, two delivery units TRS are provided. Note that, hereinafter, a delivery unit TRS which houses a substrate G before the treatment by the substrate treatment apparatus 1 is called a delivery unit TRS-IN, and a delivery unit TRS which houses a substrate G after the treatment by the substrate treatment apparatus 1 is called a delivery unit TRS-OUT in some cases.

Further, in the third block G3, a jig storage unit 50 which stores a cleaning jig is provided.

At the center in the treatment station 3, the substrate transfer unit 60 as a transfer mechanism is arranged as illustrated in FIG. 1.

The substrate transfer unit 60 has a transfer arm 61 movable, for example, in the X-direction, the Y-direction, the θ-direction, and the vertical direction. The substrate transfer unit 60 can move in the treatment station 3 and transfer the substrate G to a predetermined unit in the first block G1, the second block G2, and the third block G3 thereabound. The number of the substrate transfer units 60 arranged in the treatment station 3 may be one or plural.

The controller 4 is, for example, a computer including a CPU, a memory and so on, and includes a program storage (not illustrated). The program storage stores a program for controlling the operations of a drive system such as the above various treatment units and transfer units to thereby control the treatments on the substrate G by the substrate treatment apparatus 1. Further, a program for later-explained transfer schedule creation processing is also stored in the program storage. Note that the above programs may be the ones which are recorded in a computer-readable storage medium and installed from the storage medium into the controller 4. The storage medium may be transitory or non-transitory. Some or all of the programs may be realized by dedicated hardware (circuit board).

The controller 4 has a storage 4a, an acquirer 4b, and a creator 4c.

The storage 4a is for storing various kinds of information, and stores, for example, data for creating a transfer schedule of the substrate G. Note that the transfer schedule includes information on a transfer destination of each substrate G and information on a transfer order, namely, information on a transfer route, and includes information on transfer timing to each transfer destination, namely, information on a transfer time. Besides, the data for creating the transfer schedule is, for example, a transfer recipe and a treatment recipe.

In the transfer recipe, information for setting a transfer route until the substrate G transferred out of the cassette C-IN is transferred into the cassette C-OUT after being treated in the substrate treatment apparatus 1 is set. Each transfer recipe includes one or a plurality of transfer processes (steps) executed in sequence, and one or a plurality of transfer destination candidates are set for each transfer process.

In the treatment recipe, information about the contents of the treatment performed in each treatment unit is set. For example, in the treatment recipe, information about the rotation speed of the substrate G and the supply time of the treatment solution is set in the case of the solution treatment unit 30, and information about the temperature setting value and the temperature regulation time is set in the case of the thermal treatment unit 40. The treatment recipe can be selected from among a plurality of kinds according to a later-explained process job set for the substrate G.

The acquirer 4b acquires a process job. The process job is for transferring the substrate G to at least one treatment unit by the substrate transfer unit 21 and the substrate transfer unit 60 and performing the treatment on the substrate G. Specifically, the process job is for deciding the treatment to be performed using the treatment unit on the substrate G, for each substrate group. The process job is set in advance for each cassette C (because one substrate G is housed in each cassette C in this embodiment as explained above), namely, for each substrate G in this embodiment. Besides, the process job includes identification information on the process job, identification information on the substrate G for which each process job is set, and information for specifying the treatment recipe to be executed on each substrate G.

This process job is stored, for example, in a host computer (not illustrated) which manages apparatuses in a factory in which the substrate treatment apparatus 1 is installed, and the acquirer 4b acquires the process job from the host computer via a communicator (not illustrated).

In this embodiment, the transfer-in order of the substrates G from the cassettes C-IN being the transfer start positions for the substrates G into the substrate treatment apparatus 1 is predetermined. The creator 4c decides the transfer schedule of the substrate G for each substrate G and in the transfer-in order. Note that the transfer-in order of the substrates G from the cassettes C-IN into the substrate treatment apparatus 1 is the order in which the cassettes C-IN housing the substrates G are mounted on the cassette stage 12.

Specifically, the creator 4c selects a treatment recipe to be executed for a schedule creation target substrate G (hereinafter abbreviated as a "creation target substrate G" in some cases), and selects a treatment unit which can execute the treatment set in the treatment recipe based on the information set in the process job. The creator 4c selects a transfer recipe including the selected treatment unit and including the delivery unit TRS, the buffer unit SBU and so on through which the substrate G passes until the substrate G is transferred into each treatment unit, and decides a transfer route for the schedule creation target substrate G based on the transfer recipe. The creator 4c then creates a transfer schedule of the schedule creation target substrate G based on the decided transfer route.

The transfer schedule created by the creator 4c is stored in the storage 4a.

A more concrete creation method of e transfer schedule by the creator 4c will be explained later.

Next, an example of the operation of the substrate treatment apparatus 1 configured as above will be explained.

Once the cassette C-IN is transferred into the cassette stage 12 by the cassette transfer apparatus (not illustrated), the acquirer 4b acquires the process job for one substrate G housed in the cassette C-IN from the host computer (not illustrated). Then, the creator 4c creates the transfer schedule based on the process job acquired by the acquirer 4b for the one substrate G housed in the cassette.

Then, based on the created transfer schedule, the controller 4 performs the treatment based on the process job on the substrate G while controlling the substrate transfer units 21, 60 and so on to transfer the substrate G. For example, the substrate transfer unit 21 first transfers the substrate G from the cassette C-IN into the substrate treatment apparatus 1. Note that once the substrate G is taken out, the cassette C-IN is removed from the cassette stage 12 by the cassette transfer apparatus (not illustrated).

Then, the substrate transfer unit 21 transfers the substrate G via the buffer unit SBU-IN or directly to the delivery unit TRS-IN. Then, the substrate transfer unit 60 transfers the substrate G to the treatment unit selected based on the process job according to the transfer schedule. Upon completion of the treatments in all of the treatment units selected based on the process job, the substrate transfer unit 60 transfers the substrate G from the treatment unit which has performed the last treatment to the delivery unit TRS-OUT. Then, the substrate transfer unit 21 transfers the substrate G from the delivery unit TRS-OUT via the buffer unit SBU-OUT or directly to the cassette C-OUT being the transfer end position. Note that the cassette C-OUT is mounted on the cassette stage 12 when the corresponding substrate G is transferred to the delivery unit IRS-OUT or the buffer unit SBU-OUT.

Example 1 of the Transfer Schedule Creation Processing

Subsequently, an example of the transfer schedule creation processing will be explained.

In this embodiment, the process job is set in advance for each substrate G as explained above. Therefore, the schedule creation target substrate G by the creator 4*c* and a preceding substrate G (hereinafter abbreviated as "uncompleted substrate G") for which the treatment based on the process job is uncompleted at the time point when the schedule creation target substrate G is transferred in are different in (identification information on) process job. Note that the time point when the creation target substrate G is transferred in is concretely for example, the time point when the cassette C housing the creation target substrate G is transferred into the substrate treatment apparatus 1.

Even if the process job for the creation target substrate G and the process job for the uncompleted substrate G are different, the same kind of treatment as the treatment by the treatment unit included in the process job for the former is included in the process job for the latter in some cases.

In creating the transfer schedule of the creation target substrate G, when the process jobs are different from each other but the same kind of treatment is included in both of them as explained above, the creator 4*c* makes the following determination. Specifically, the creator 4*c* determines the possibility of performing preceding execution of executing the above same kind of treatment on the creation target substrate G (hereinafter, referred to as "preceding execution of the same kind of treatment") previous to the completion of the same kind of treatment on the uncompleted substrate G. In this event, the transfer schedule of the uncompleted substrate G which has been previously created is not changed. Then, the creator 4*c* creates the transfer schedule of the creation target substrate G based on the determination result of the possibility of the preceding execution of the same kind of treatment. In the creation, the standby time in the buffer unit SBU-IN included in the transfer schedule is set based on the determination result.

The creator 4*c* determines the possibility of the preceding execution of the same kind of treatment, for example, based on whether the treatment unit which performs the treatment based on the process job coincides between the uncompleted substrate G and the schedule creation target substrate G. Then, when the treatment unit does not coincide, the creator 4*c* determines that the preceding execution of the same kind of treatment is possible.

Figure 4:
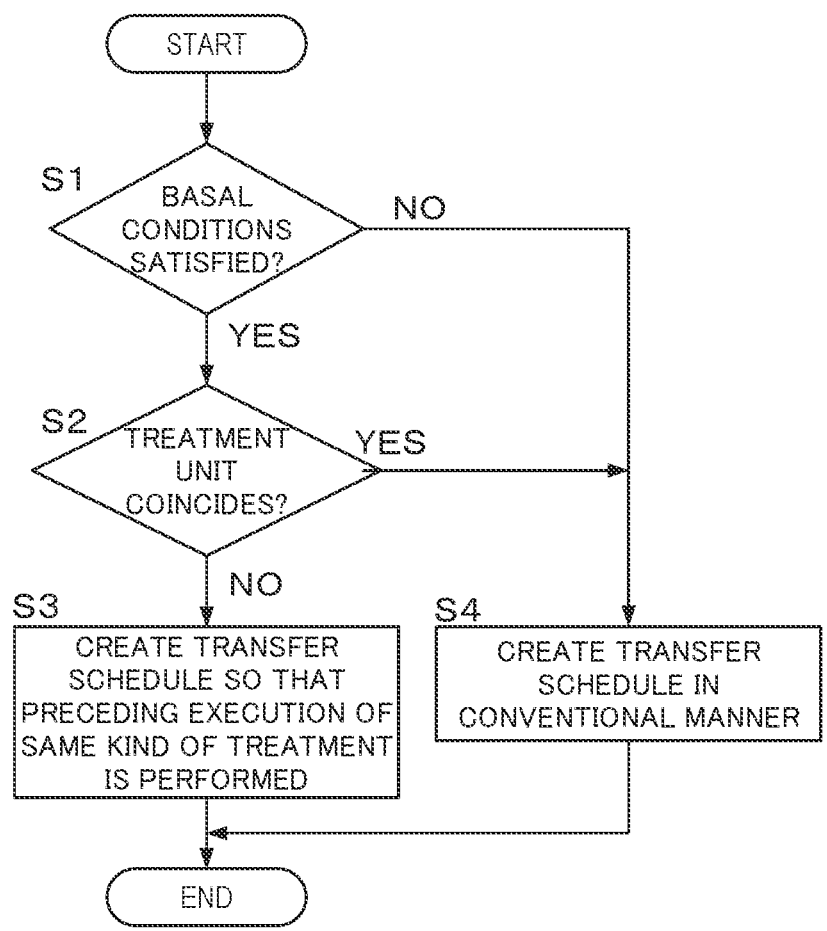
FIG. 4 is a flowchart illustrating the flow of an example of transfer schedule creation processing.

FIG. 4 is a flowchart illustrating the flow of an example of the transfer schedule creation processing by the creator 4*c*. FIG. 5 is a diagram illustrating an example of the transfer schedule created in the creation processing in this example. Note that, hereinafter, it is assumed that the same kind of treatment is included in the process job for the schedule creation target substrate G and the process job for the uncompleted substrate G.

In creating the transfer schedule of the schedule creation target substrate G, the creator 4*c* first determines whether basal conditions are satisfied (Step S1). More specifically, the creator 4*c* decides the transfer route for the schedule creation target substrate G including the treatment unit to be used for the treatment on the schedule creation target substrate G based on the information on the process job acquired by the acquirer 4*b*. Further, the creator 4*c* acquires the transfer schedule of the uncompleted substrate G. Then, the creator 4*c* determines whether all of the following basal conditions (A1) to (A4) are satisfied based on the transfer route and the process job for the schedule creation target substrate G and the transfer schedule of the uncompleted substrate G.

(A1) Substrates G equal to or more than the remaining number of substrates G to be housed in the buffer units SBU do not exist in the treatment station 3.

(A2) The schedule creation target substrate G and the uncompleted substrate G differ in process job.

(A3) The transfer route decided for the schedule creation target substrate G uses the transfer recipe in which only one transfer destination candidate is set for each of all of transfer processes (steps) the treatment station 3.

(A4) The transfer route decided for the schedule creation target substrate G includes the buffer unit SBU-IN and the buffer unit SBU-OUT.

The above (A1) is the condition for preventing the substrate G from staying in the treatment station 3 when the preceding execution of the same kind of treatment is performed.

The above (A3) is the condition for limiting the opportunity to determine the possibility of the preceding execution of the same kind of treatment.

The condition about the buffer unit SBU-IN of the above (4) is the condition for the substrate G whose transfer into the treatment station 3 needs to be suspended until the end of the treatment on the preceding substrate G. Besides, the condition about the buffer unit SBU-OUT is the condition for the substrate G whose transfer to the cassette C-OUT needs to be suspended until the corresponding cassette C-OUT is mounted on the cassette stage 12.

Note that, in place of the condition of the above (A3), the fact that the transfer route uses the following transfer recipe may be the condition. More specifically, this is the condition that when only the transfer processes about the same kind of treatment included in both process jobs for the creation target substrate G and the uncompleted substrate G are extracted, the transfer recipe in which only one transfer destination candidate is set for each of the extracted transfer processes.

When the above basal conditions are satisfied (Step S1, in the case of YES), the creator 4*c* determines the possibility of the preceding execution of the same kind of treatment based on whether the treatment unit which performs the treatment based on the process job coincides between the schedule creation target substrate G and the uncompleted substrate G (Step S2). This determination is made based on the transfer route for the schedule creation target substrate G decided by the creator 4*c* and the transfer schedule of the uncompleted substrate G acquired by the creator 4*c*.

When the treatment unit does not coincide and it is determined that the preceding execution of the same kind of treatment is possible for the schedule creation target substrate G (Step S2, in the case of NO), the creator 4*c* creates the transfer schedule so that the preceding execution of the same kind of treatment is performed for the schedule creation target substrate G (Step S3). For example, the creator 4*c* creates the transfer schedule of the schedule creation target substrate G by setting the standby time in the buffer unit SBU-IN so that the substrate G is transferred in the shortest route to the treatment unit which performs the treatment based on the process job along the decided transfer route.

On the other hand, when the treatment unit coincides and it is determined that the preceding execution of the same kind of treatment is impossible for the schedule creation target substrate G at Step S2 (in the case of YES), the creator 4c decides the transfer schedule as in the conventional manner for the schedule creation target substrate G (Step S4). For example, the creator 4c creates the transfer schedule of the schedule creation target substrate G by setting the standby time in the buffer unit SRU-IN as follows. Specifically, the creator 4c sets the standby time in the buffer unit SBU-IN so that the schedule creation target substrate G is not transferred to the treatment unit until the treatment on the uncompleted substrate G in the treatment unit coinciding between the schedule creation target substrate G and the uncompleted substrate G is completed and the uncompleted substrate G is transferred out of the treatment unit.

Besides, when the above basal conditions are not satisfied at Step S1 (in the case of NO), the creator 4c creates the transfer schedule as in the conventional manner as at Step S2, for the schedule creation target substrate G (Step S4).

Here, it is assumed that a substrate G in a process job PJ1, a substrate G in a process job PJ2, and a substrate G in a process job PJ3 are transferred in this order from the cassettes C-IN into the substrate treatment apparatus 1 as illustrated in FIG. 5. Further, it is assumed that the transfer schedule has been already created for the substrate G in the process job PJ1.

The transfer route for the substrate G in the process job PJ1 is the cassette C-IN→the buffer unit SBU-IN→the delivery unit TRS-IN→the solution treatment unit 31 for rise treatment→the thermal treatment unit 40→the solution treatment unit 30 for developing treatment→the delivery unit TRS-OUT→the buffer unit SBU-OUT→the cassette C-OUT.

The transfer route for the substrate G in the process job PJ2 is the cassette C-IN→the buffer unit SBU-IN→the delivery unit TRS-IN→the solution treatment unit 30 for developing treatment→the delivery unit TRS-OUT→the buffer unit SBU-OUT→the cassette C-OUT.

The transfer route for the substrate G in the process job PJ3 is the cassette C-IN→the buffer unit SBU-IN→the delivery unit TRS-IN→the thermal treatment unit 41→the delivery unit TRS-OUT→the buffer unit SBU-OUT→the cassette C-OUT.

Since the solution treatment unit 30 for developing treatment coincides between the substrate G in the process job PJ2 and the uncompleted substrate G in the process job PJ1, the substrate G in the process job PJ2 corresponds to the case of YES at Step S2. Therefore, the creator 4c creates the transfer schedule of the substrate G in the process job PJ2 as in the conventional manner. For this reason, in the transfer schedule of the substrate G in the process job PJ2, the standby time in the buffer unit SBU-IN is set long so that the developing treatment in the solution treatment unit 30 for the substrate G in the process job PJ2 is started after the developing treatment in the solution treatment unit 30 in the process job RJ1 is finished.

In contrast to the above, since there is no treatment unit coinciding between the substrate G in the process job PJ3, and, the uncompleted substrate G in the process job PJ1 and the uncompleted substrate G in the process job PJ2, the substrate G in the process job PJ3 corresponds to the case of NO at Step S2. Therefore, the creator 4c creates the transfer schedule of the substrate G in the process job PJ3 so that the preceding execution of the same kind of treatment (here, the thermal treatment) is performed and, more specifically, creates the transfer schedule in which the standby time in the buffer unit SBU-IN is shortest.

As explained above, in this embodiment, the creator 4c determines in creating the transfer schedule, when the process job is different between the schedule creation target substrate G and the uncompleted substrate G and the same kind of treatment is included in the respective process jobs, the possibility of performing the preceding execution of the same kind of treatment. Accordingly, by creating the transfer schedule based on the possibility of performing the preceding execution of the same kind of treatment in the substrate treatment apparatus 1, it is possible to reduce the time (also including the time for the treatment in each treatment unit) from the transfer of each substrate G into the substrate treatment apparatus 1 to the transfer out. In other words, it is possible to create the transfer schedule in which the time from the transfer into the substrate treatment apparatus 1 to the transfer out is short, for the schedule creation target substrate G different in process job from the uncompleted substrate G. As a result, the throughput can be further improved.

Example 2 of the Transfer Schedule Creation Processing

In this example, when a single treatment unit performs the treatment on the creation target substrate G and coincides with that for the uncompleted substrate G, the creator 4c determines whether a scheduled time until the schedule creation target substrate G is transferred out of the treatment unit is shorter than a scheduled time until the uncompleted substrate G reaches the coinciding treatment unit. Then, when the scheduled time until the transfer out is shorter, the creator 4c determines that the preceding execution of the same kind of treatment is possible, and creates the transfer schedule based on the determination result for the schedule creation target substrate G.

Figure 6:
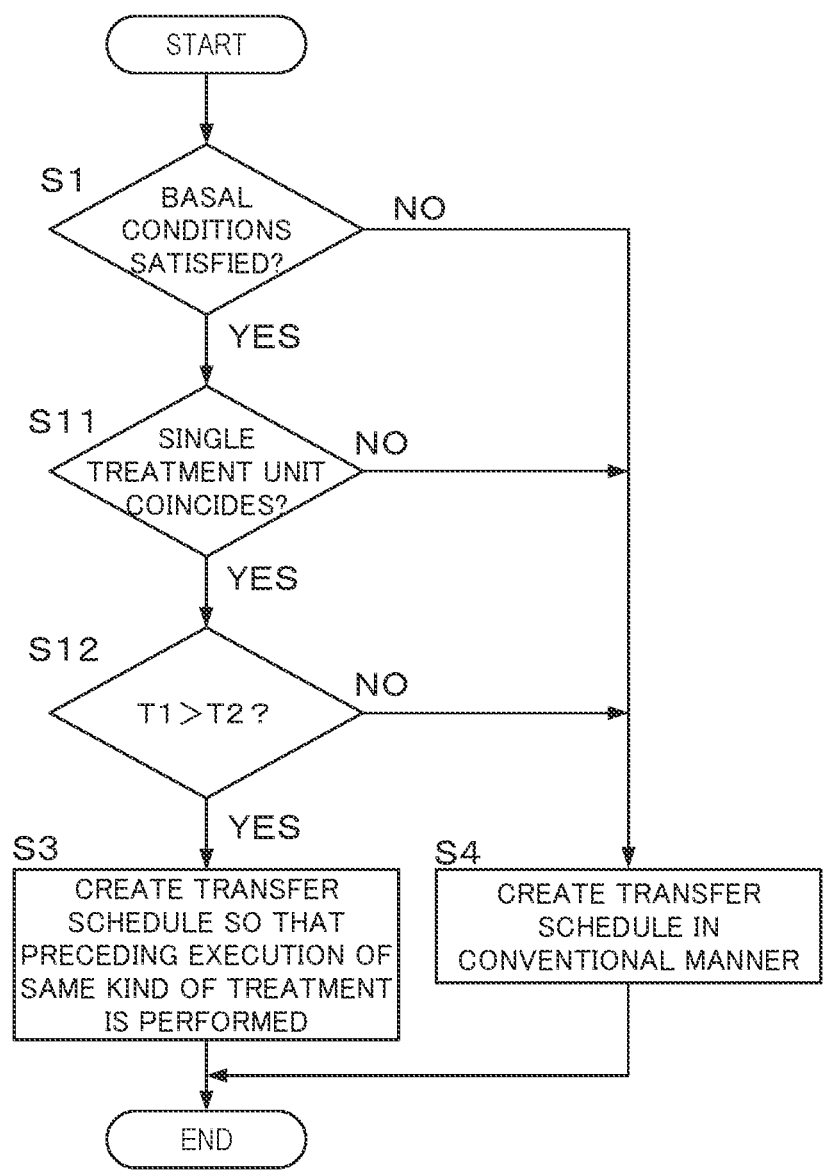
FIG. 6 is a flowchart illustrating the flow of another example of the transfer schedule creation processing.

FIG. 6 is a flowchart illustrating the flow of the transfer schedule creation processing in this example. FIG. 7 is a diagram illustrating an example of the transfer schedule created in the creation processing in this example. Note that, hereinafter, it is assumed that the same kind of treatment is included in the process job for the schedule creation target substrate G and the process job for the uncompleted substrate G.

When the above basal conditions are satisfied at Step S1 (Step S1, in the case of YES), the creator 4c determines whether a single treatment unit performs the treatment on the schedule creation target substrate G and coincides with that for the uncompleted substrate G (Step S11). This determination is made based on the transfer route for the schedule creation target substrate G decided by the creator 4c and the transfer schedule of the uncompleted substrate G acquired by the creator 4c.

When at least one of the condition of being a single treatment unit and the condition that the treatment unit coincides is not satisfied and it is determined that the preceding execution of the same kind of treatment is impossible for the schedule creation target substrate G (Step S11, in the case of NO), the creator 4c decides the transfer schedule as in the conventional manner for the schedule creation target substrate G.

On the other hand, when both of the conditions are satisfied (Step S11, in the case of YES), the creator 4c determines whether a scheduled time T2 until the schedule creation target substrate G is transferred out of the treatment unit is shorter than a scheduled time T1 until the uncompleted substrate G reaches the coinciding treatment unit (Step S12). The scheduled time T1 until the reach is calculated by the creator 4c based on the transfer schedule of the uncompleted substrate G Further, the scheduled time T2 until the transfer out is calculated by the creator 4c according to the following expression, for example, based on a shortest time T21 required until the substrate G reaches the treatment unit from the cassette C-IN and a treatment time T22 in the treatment unit.

$$T2=T21+T22$$

Of information on the shortest time T21 and information on the treatment time T22 in the treatment unit which are required for the calculation of the scheduled time T2 until the transfer out, the former is stored, for example, in advance in the storage 4a, and the latter is indicated in a process recipe specified by the process job.

Note that the creator 4c may calculate the scheduled time T2 until the transfer out according to the following expression in consideration of a margin 123.

$$T2=T21+T22+T23$$

The margin T23 is set in consideration of, for example, a delay time or the like due to the transfer of another substrate G.

When the scheduled time T2 until the transfer Out is longer than the scheduled time T1 until the reach and it is determined that the preceding execution of the same kind of treatment is impossible for the schedule creation target substrate G (Step S12, in the case of NO), the creator 4c decides the transfer schedule as in the conventional manner for the schedule creation target substrate G.

On the other hand, when the scheduled time T2 until the transfer out is shorter than the scheduled time T1 until the reach and it is determined that the preceding execution of the same kind of treatment is possible for the schedule creation target substrate G (Step S12, in the case of YES), the creator 4c creates the transfer schedule so that the preceding execution of the same kind of treatment is performed on the schedule creation target substrate G.

Here, it is assumed that the substrate G in the process job PJ1 and the substrate G in the process job PJ2 are transferred in this order from the cassettes C-IN into the substrate treatment apparatus 1 as illustrated in FIG. 7. Further, it is assumed that the transfer schedule has been already created for the substrate G in the process job PJ1.

Since the treatment unit which performs the treatment on the substrate G in the process job PJ2 is only the solution treatment unit 30 for developing treatment, namely, single, and coincides with that for the uncompleted substrate C in the process job PJ1, the substrate G in the process job PJ2 corresponds to the case of YES at Step S11. Further, the scheduled time T2 unit the substrate G in the process job PJ2 is transferred out of the solution treatment unit 30 for developing treatment is shorter than the scheduled time T1 until the uncompleted substrate G in the process job PJ1 reaches the solution treatment unit 30 for developing treatment. Therefore, the substrate G in the process job PJ2 corresponds to the case of YES at Step S12.

Therefore, the creator 4c creates the transfer schedule so that the preceding execution of the same kind of treatment (preceding execution of the developing treatment) is performed for the substrate G in the process job PJ2 and, more specifically, creates the transfer schedule so that the standby time in the buffer unit SUB-IN is shortest.

The condition for determining the possibility of the preceding execution of the same kind of treatment includes the condition that a single treatment unit performs the treatment on the schedule creation target substrate G as explained above, thereby providing the following effect. Specifically, when it is determined that the preceding execution of the same kind of treatment is possible, the calculation of the influence on a process of performing another treatment is unnecessary, thus providing the effect capable of easily creating the transfer schedule.

Example 3 of the Transfer Schedule Creation Processing

In this example, when a plurality of treatment units which perform the treatments based on the process job coincide between the schedule creation target substrate G and the uncompleted substrate G, the creator 4c makes the following determination. More specifically, the creator 4c determines whether a scheduled time until the schedule creation target substrate G is transferred out of the treatment unit is shorter than a scheduled time until the uncompleted substrate G reaches the treatment unit for each of the coinciding treatment units. Then, when the scheduled time until the transfer out is shorter in each of the coinciding treatment units, the creator 4c determines that the preceding execution of the same kind of treatment is possible, and creates the transfer schedule based on the determination result for the schedule creation target substrate G.

Figure 8:
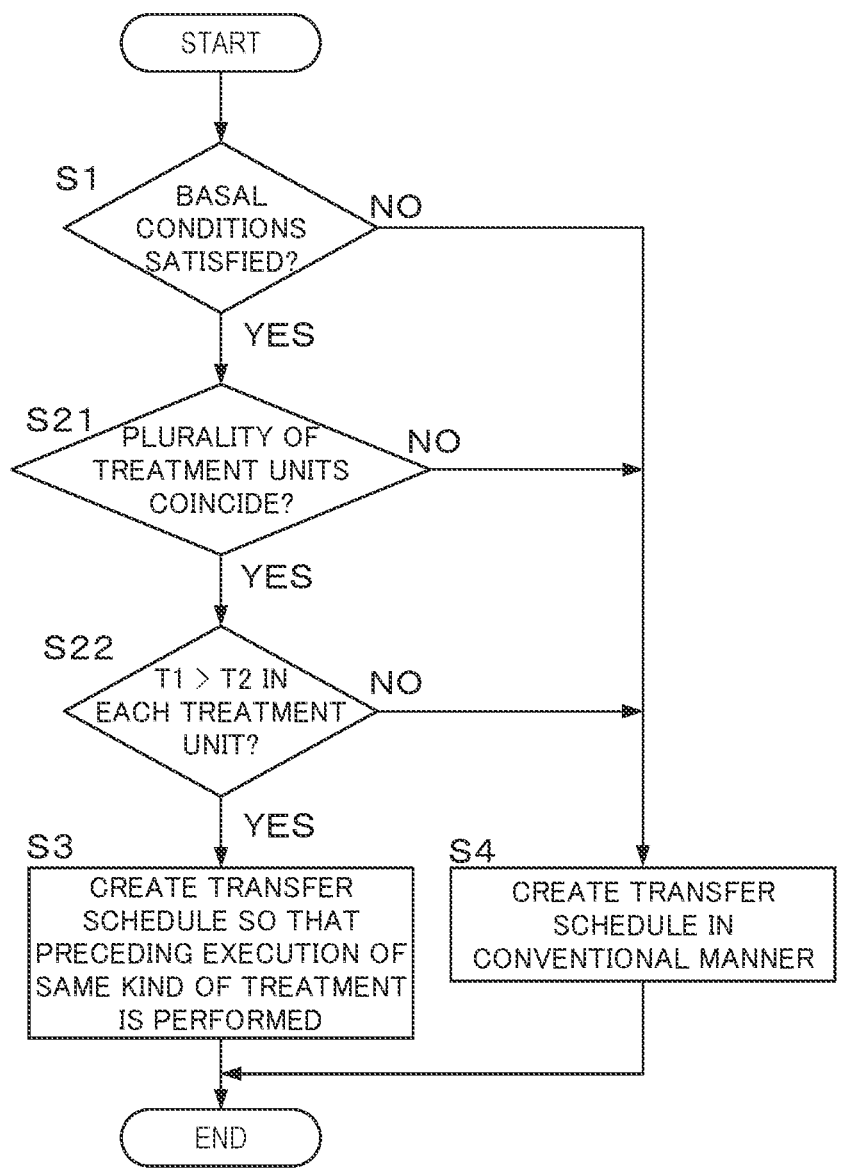
FIG. 8 a flowchart illustrating the flow of another example of the transfer schedule creation processing.

FIG. 8 is a flowchart illustrating the flow of the transfer schedule creation processing in this example. FIG. 9 is a diagram illustrating an example of the transfer schedule created in the creation processing in this example. Note that, hereinafter, it is assumed that the same kind of treatment is included in the process job for the schedule creation target substrate G and the process job for the uncompleted substrate G.

When the above basal conditions are satisfied at Step S1 (Step S1, in the case of YES), the creator 4c determines whether a plurality of treatment units which perform the treatments based on the process job coincide between the schedule creation target substrate G and the uncompleted substrate G (Step S21). This determination is made based on the transfer route for the schedule creation target substrate G decided by the creator 4c and the transfer schedule of the uncompleted substrate G acquired by the creator 4c.

When the plurality of treatment units do not coincide and it is determined that the preceding execution of the same kind of treatment is impossible for the schedule creation target substrate G (Step S21, in the case of NO), the creator 4c decides the transfer schedule as in the conventional manner for the schedule creation target substrate G.

On the other hand, when the plurality of treatment units coincide (Step S21, in the case of YES), the creator 4c determines whether a scheduled time T2 until the schedule creation target substrate G is transferred out of the treatment unit is shorter than a scheduled time T1 until the uncompleted substrate G reaches the coinciding treatment unit for each of the plurality of coinciding treatment units (Step S22).

When the scheduled time T2 until the transfer out is longer than the scheduled time T1 until the reach even in one of the coinciding treatment units and it is determined that the preceding execution of the same kind of treatment is impossible for the schedule creation target substrate G (Step S12, in the case of NO), the creator 4c decides the transfer schedule as in the conventional manner for the schedule creation target substrate G.

On the other hand, when the scheduled time T2 until the transfer out is shorter than the scheduled time T1 until the reach in all of the coinciding treatment units and it is determined that the preceding execution of the same kind of treatment is possible for the schedule creation target substrate G (Step S12, in the case of YES), the creator 4c creates the transfer schedule so that the preceding execution of the same kind of treatment is performed for the schedule creation target substrate G.

Here, it is assumed that the substrate G in the process job PJ1 and the substrate G in the process job PJ4 are transferred in this order from the cassettes C-IN into the substrate treatment apparatus 1 as illustrated in FIG. 9. Further, it is assumed that the transfer schedule has been already created for the substrate G in the process job PJ1.

The transfer route for the substrate G in the process job PJ4 is the cassette C-IN→the buffer unit SBU-IN→the delivery unit TRS-IN→the thermal treatment unit 40→the solution treatment unit 30 for developing treatment→the delivery unit TRS-OUT→the buffer unit SBU-OUT→the cassette C-OUT.

Since two, namely, a plurality of treatment units such as the thermal treatment unit 40 and the solution treatment unit 30 for developing treatment coincide between the substrate G in the process job PJ4 and the uncompleted substrate G in the process job PJ1, the substrate G in the process job PJ4 corresponds to the case of YES at Step S21. Further, the scheduled time T2 until the substrate G in the process job PJ4 is transferred out of the treatment unit is shorter than the scheduled time T1 until the uncompleted substrate G in the process job PJ1 reaches the treatment unit for each of the thermal treatment unit 40 and the solution treatment unit 30 for developing treatment. Therefore, the substrate G in the process job PJ4 corresponds to the case of YES at Step S22.

Accordingly, the creator 4c creates the transfer schedule so that the preceding execution of the same kind of treatment is performed for the substrate G in the process job PJ4 and, more specifically, creates the transfer schedule in which the standby time in the buffer unit SBU-IN is shortest.

Note that the operations of the creator 4c in Examples 2, 3 of the transfer schedule creation processing can be collectively described in other words as follows.

In Examples 2, 3, when the treatment unit which performs the treatment based on the process job coincides between the schedule creation target substrate G and the uncompleted substrate G, the creator 4c determines whether the scheduled time until the schedule creation target substrate G is transferred out of the treatment unit is shorter than the scheduled time until the uncompleted substrate G reaches the treatment unit for each coinciding treatment unit. In Examples 2, 3, the creator 4c determines that the preceding execution of the same kind of treatment is possible when the scheduled time until the transfer out is shorter in each coinciding treatment unit, and creates the transfer schedule based on the determination result for the schedule creation target substrate G.

Note that all of Examples 1 to 3 of the transfer schedule creation processing may be used in conjunction, or a plurality of combinations of above Examples 1 to 3 may be used in conjunction.

As in Examples 1 to 3 of the transfer schedule creation processing, once the transfer schedule is decided, the transfer schedule basically designates the transfer of the substrate G to the buffer unit SBU-IN and the buffer unit SBU-OUT. Even in the case where the transfer is designated as above, the substrate transfer unit 21 may transfer the substrate G in a manner of not passing through the buffer unit SBU-IN and the buffer unit SBU-OUT based on whether a predetermined condition is satisfied. The predetermined condition about the buffer unit SBU-IN is, for example, that it is determined that the preceding execution of the same kind of treatment is possible for the substrate G to be transferred. The predetermined condition about the buffer unit SBU-OUT is, for example, that the cassette C-OUT corresponding to the substrate G to be transferred is mounted on the cassette stage 12.

By transferring the substrate G in a manner of not passing through the buffer units SBU as explained above, it is possible to omit the transfer of the substrate G from the buffer unit SBU and the transfer of the substrate to the buffer unit SBU, resulting in reduced load on the substrate transfer unit 21. According to the reduced load as above, the substrate transfer unit 21 can be used for the transfer of the substrate contributing to higher throughput. Therefore, by transferring the substrate G in a manner of not passing through the buffer units SBU, the throughput of the substrate treatment apparatus 1 can be further increased.

The above transfer schedule creation processing is applicable also to the creation of the transfer schedule of a transfer object other than the substrate to be transferred in the substrate treatment apparatus 1 as with the substrate. The transfer object other than the substrate is, for example, the cleaning jig transferred to the solution treatment units 30, 31 and used for cleaning the solution treatment units. Note that the jig storage unit 50 corresponds to the transfer start position and the standby part for the cleaning jig.

Further, a plurality of substrates G in a state of being transferable by the substrate transfer unit 60 exist in the substrate treatment apparatus 1 in some cases. In this case, the substrate transfer unit 60 may preferentially transfer a substrate which has not yet been subjected to the treatment by the treatment unit. The substrate transfer unit 60 may most preferentially transfer the substrate G housed in the delivery unit TRS-IN. This can increase the number of the substrates G in the treatment station 3. Also the substrate transfer unit 21 may preferentially transfer a substrate which has not yet been subjected to the treatment by the treatment unit. The substrate transfer unit 21 may most preferentially transfer the substrate G, for example, to the delivery unit TRS-IN. This can reduce the time when the treatment unit not in use.

Further, when the substrate G requiring the change in temperature of the hot plate 46 is the schedule creation target in the thermal treatment by the thermal treatment unit 40 to 44, the transfer schedule of the substrate G may be created so that the substrate G stands by in the buffer unit SBU-IN until the temperature of the hot plate 46 stabilizes. This can reduce the time when the treatment unit in the substrate treatment apparatus 1 is not in use until the temperature of the hot plate 46 stabilizes as compared with the case of standing by in the cassette C, resulting in further increased throughput.

In the above example, the determination of the possibility of the preceding execution of the same kind of treatment is made for the schedule creation target substrate G in creating the transfer schedule. The determination of the possibility of the preceding execution of the same kind of treatment may be made between a following substrate G and a preceding substrate G after the transfer schedule is created and before the following substrate G is transferred into the treatment unit according to the transfer schedule. Then, based on the determination result, the transfer schedule of the following substrate G may be corrected.

Note that in the case of using the same treatment unit between the following substrate G and the preceding substrate G, it is preferable, in order to improve the throughput, to perform the treatment using the above same treatment unit for the following substrate G just after the completion of the treatment using the above same treatment unit for the preceding substrate G without an excessive interval. To make it possible, the standby time in the buffer unit SBU-IN in the transfer schedule of the following substrate G is decided or corrected.

When the transfer schedule of the following substrate G has been corrected based on the determination result of the possibility of the preceding execution of the same kind of treatment, the treatment unit may coincide between the following substrate G and the preceding substrate G in terms of schedule in the treatment other than the above same kind of treatment. Therefore, when the transfer schedule of the following substrate G has been corrected based on the determination result of the possibility of the preceding execution of the same kind of treatment, whether the correction of the standby time is necessary may be determined, and an appropriate standby time may be set.

The standby time in the buffer unit SBU-1N is decided or corrected, for example, as follows.

First, if the standby time is not set, the treatment unit whose time from the timing of transfer in of the following substrate G to the timing of transfer out of the directly preceding substrate G is longest is specified. Then, the standby time is decided or corrected so that the following substrate G is transferred into the specified treatment unit just after the preceding substrate G is transferred out of the treatment unit.

In this example, the standby time in the buffer unit SBU-IN for the following substrate G is measured with the time point when the following substrate G is transferred into the buffer unit SBU-IN as a reference, The standby time in the buffer unit SBU-IN for the following substrate G may be measured with the following time point may be used as a reference. For example, the standby time may be measured with, as a reference, the time point when the directly preceding substrate for the treatment unit is transferred into the treatment unit in which the time coincides between the following substrate G and the preceding substrate G and into which the following substrate G is transferred first. In this case, the standby time in the buffer unit SBU-IN for the following substrate G is decided or corrected so that the following substrate G is transferred into the treatment unit just after the directly preceding substrate is transferred out of the treatment unit in which the time coincides and into which the following substrate G is transferred first. As another method, the operation state (though not illustrated, the operation state of the device in the unit or the substrate) of the treatment unit while the preceding substrate is being treated in the treatment unit may be used as the above reference.

The embodiments disclosed herein are examples in all respects and should not be considered to be restrictive. Various omissions, substitutions and changes may be made in the embodiments without departing from the scope and spirit of the attached claims.

According to this disclosure, the throughput can be further improved in a substrate treatment apparatus for treating the substrate.

What is claimed is:

1. A substrate treatment apparatus for treating a substrate, comprising:
   a plurality of treatment parts each configured to perform a predetermined treatment;
   a transfer mechanism configured to transfer a transfer object, a plurality of transfer objects being transferred in a predetermined transfer-in order into the substrate treatment apparatus; and
   a controller configured to acquire a process job for transferring the transfer object by the transfer mechanism to at least one of the treatment parts and performing the treatment on the transfer object, wherein
   the controller is configured to determine before starting transfer of one transfer object to the treatment part, when the process job is different between the one transfer object and a preceding transfer object transferred into the substrate treatment apparatus prior to the one transfer object and a same kind of treatment is included in the respective process jobs thereof a possibility of performing preceding execution of executing the same kind of treatment on the one transfer object previous to completion of the same kind of treatment on the preceding transfer object.

2. The substrate treatment apparatus according to claim 1, wherein
   the controller is configured to:
   determine whether to perform the preceding execution based on whether the treatment part which performs the treatment based on the process job coincides between the one transfer object and the preceding transfer object; and
   determine to perform the preceding execution when the treatment part does not coincide.

3. The substrate treatment apparatus according to claim 1, wherein
   the controller is configured to:
   determine, when a single treatment part performs the treatment based on the process job on the one transfer object and coincides with a treatment part for the preceding transfer object, whether to perform the preceding execution based on whether a scheduled time until the one transfer object is transferred out of the treatment part is shorter than a scheduled time until the preceding transfer object reaches the coinciding treatment part; and
   determine to perform the preceding execution when the scheduled time until the one transfer object is transferred out is shorter.

4. The substrate treatment apparatus according to claim 1, wherein
   the controller is configured to:
   determine, when a plurality of the treatment parts which perform the treatments based on the process job coincide between the one transfer object and the preceding transfer object, whether to perform the preceding execution based on whether a scheduled time until the one transfer object is transferred out of the treatment part is shorter than a scheduled time until the preceding transfer object reaches the treatment part in each of the coinciding treatment parts; and
   determine to perform the preceding execution when the scheduled time until the one transfer object is transferred out is shorter in each of the coinciding treatment parts.

5. The substrate treatment apparatus according to claim 1, further comprising
a standby part configured to allow a transfer object to stand by, wherein
the transfer mechanism is configured to transfer a transfer object designated to be transferred to the standby part by the transfer schedule, in a manner of not passing through the standby part, when a predetermined condition is satisfied.

6. The substrate treatment apparatus according to claim 1, wherein
the transfer mechanism is configured to preferentially transfer a transfer object which has not yet been subjected to the treatment by the treatment part when a plurality of transfer objects in a state of being transferable by the transfer mechanism exist in the substrate treatment apparatus.

7. The substrate treatment apparatus according to claim 1, wherein
the transfer object is a mask substrate to be used in manufacture of a mask having a predetermined pattern formed thereon.

8. A method of creating a transfer schedule of a transfer object in a substrate treatment apparatus for treating a substrate, the substrate treatment apparatus, comprising:
a plurality of treatment parts each configured to perform a predetermined treatment; and
a transfer mechanism configured to transfer a transfer object, a plurality of transfer objects being transferred in a predetermined transfer-in order into the substrate treatment apparatus,
the method comprising:
acquiring a process job for transferring the transfer object by the transfer mechanism to at least one of the treatment parts and performing the treatment on the transfer object; and
determining before starting transfer of one transfer object to the treatment part, when the process job is different between the one transfer object and a preceding transfer object transferred into the substrate treatment apparatus prior to the one transfer object and a same kind of treatment is included in the respective process jobs thereof, a possibility of performing preceding execution of executing the same kind of treatment on the one transfer object previous to completion of the same kind of treatment on the preceding transfer object.

* * * * *